United States Patent [19]

Ballman et al.

[11] Patent Number: 5,326,423
[45] Date of Patent: Jul. 5, 1994

[54] DOPED CRYSTALLINE TITANYL ARSENATES AND PREPARATION THEREOF

[75] Inventors: Albert A. Ballman, Toms River, N.J.; Lap K. Cheng, Bear, Del.

[73] Assignee: E. I. du Pont de Nemours and Company, Wilmington, Del.

[21] Appl. No.: 954,174

[22] Filed: Sep. 30, 1992

Related U.S. Application Data

[63] Continuation-in-part of Ser. No. 857,050, Mar. 25, 1992, abandoned.

[51] Int. Cl.$^5$ .................................................. C30B 9/12
[52] U.S. Cl. .................................. 252/584; 117/3; 117/17; 117/80; 117/944
[58] Field of Search ............... 156/600, 605, 621, 622, 156/623 R, 624, DIG. 70, DIG. 85, DIG. 114

[56] References Cited

U.S. PATENT DOCUMENTS

| | | | |
|---|---|---|---|
| 3,949,323 | 4/1976 | Bierlein et al. | 332/7.51 |
| 4,231,838 | 11/1980 | Gier | 156/600 |
| 4,305,778 | 12/1981 | Gier | 156/623 |
| 4,746,396 | 5/1988 | Mariner | 156/622 |
| 4,761,202 | 8/1988 | Bordei et al. | 156/621 |
| 4,961,819 | 10/1990 | Mariner | 156/622 |
| 5,066,356 | 11/1991 | Ferretti et al. | 156/621 |
| 5,084,206 | 1/1992 | Ballman et al. | 252/301.4 F |

FOREIGN PATENT DOCUMENTS

| | | | |
|---|---|---|---|
| 0252537 | 1/1988 | European Pat. Off. | C30B 9/00 |
| 0410581 | 1/1991 | European Pat. Off. | C30B 9/00 |
| 0466260 | 1/1992 | European Pat. Off. | |

OTHER PUBLICATIONS

Ballman et al., Growth of Potassium Titonyl Phosphate (KTP) From Molten Tungstate Mitts, Journal of Crystal Growth (75) (1986) 390–394.

Bierlain et al., Observation and Poling of Ferroelectric Domains in KTiOPO4, Appl. Phys. Lett. 51 (17), Oct. 26, 1987.

Bordui et al., Compositional Uniformity in growth and Poling of Large-Diameter Lithium Nisbate Crystals, Journal of Crystal Growth 113 (1991) 61–68.

Crystal Growth of KTiOPO4 Isomorphs from Tungstate and Molyboate Flexes Cheng et al., Journal of Crystal Growth 110 (1991) 697–703.

Cheng et al., Growth of Epitaxial Thin Films in the KTiOPO4 Family of Crystals, Journal of Crystal Growth 112 (1991) 309–315.

Bierlin et al., Linear and Nonlinear Optical Properties of Flux-grown KTiOAs5O4, Appl. Phys. Lett. 54 (9), Feb. 27 1989, 783–785.

Bierlein et al., Balanced Phase Matching In Segmented KTiOPO4 Waveguides, Appl. Phys. Lett. 56(18), Apr. 30, 1990.

Jani et al., Appl. Phys. Lett., 60(19), 2327–2329 (1992).

Loiacono et al., Appl. Phys. Lett., 61(8), 895–897 (1992).

Cheng, L. K. et al., *Applied Physics Letters*, 62(4), 346–348, Jan. 25, 1993.

Cheng L. K. et al, *Journal of Crystal Growth*, 110(4), 697–703, Apr. 1991.

*Primary Examiner*—Robert Kunemund
*Assistant Examiner*—Felisa Garrett

[57] ABSTRACT

Doped crystalline compositions (e.g., single domain crystals) of MTiOAsO4 (wherein M is K, Rb and/or Cs) are disclosed which contain at least about 10 ppm total of Fe, Sc and/or In dopant. Also disclosed is a flux process which is characterized by adding said dopant to a melt containing the components for forming MTiOAsO4, in an amount effective to provide a doped single domain crystal of MTiOAsO4 containing at least 10 ppm of said dopant.

10 Claims, No Drawings

DOPED CRYSTALLINE TITANYL ARSENATES AND PREPARATION THEREOF

This application is a continuation-in-part of copending U.S. patent application Ser. No. 07/857,050, filed Mar. 25, 1992, now abandoned.

FIELD OF THE INVENTION

This invention relates to titanyl arsenate crystal analogs of potassium titanyl phosphate and their preparation using flux growth procedures, and more particularly to the use of selected dopants to provide improved crystals.

BACKGROUND OF THE INVENTION

Crystals of $KTiOPO_4$ and its analogs are considered highly useful because of their nonlinear optical properties. U.S. Pat. No. 3,949,323 teaches the use of flaw-free crystals in nonlinear optical and electro-optical applications. Of the $KTiOPO_4$ family of materials arsenate analogs (e.g., $KTiOAsO_4$) have been recognized as having larger electro-optic coefficients, larger nonlinear susceptibility and/or broader transparency in the infrared than $KTiOPO_4$; and thus can provide an improved alternative for $KTiOPO_4$ in many applications, see, for examples, Ballman et al., Appl. Phys. Lett 54 (9), 783–785 (1989) and Cheng et al., J. of Crystal Growth, 110, 697–703 (1991).

Since $KTiOPO_4$ and its isomorphs are known to decompose upon melting, hydrothermal and flux methods have commonly been used to grow crystals of these compounds. U.S. Pat. No. 4,305,778, as well as others teach preparation of the crystals by hydrothermal methods.

A desire for larger crystal size, better quality and greater durability, as well as the technical complexity of hydrothermal processes have led to continued interest in flux growth techniques and to the development of a variety of flux processes. In U.S. Pat. No. 4,231,838 crystal growth is carried out by heating certain mixtures of $MTiOXO_4$ with a nonaqueous flux $M/X/O$ (where M is selected from K, Tl, and Rb and X is selected from P and As) or their precursors to produce a nonaqueous melt. Crystal growth is affected by the use of a temperature gradient or by slow cooling of the melt at a rate of not greater than 5° C./hour.

Some flux growth methods have included the use of other fluxes to improve various aspects of crystal production. The use of tungstic anhydride flux is described by Ballman, et al., "Growth of Potassium Titanyl Phosphate (KTP) from Molten Tungstate Melts" J. of Crystal Growth 75, 390–394 (1986) to improve the yield of quality crystals. The use of tungstate and molybdate fluxes for crystal growth is described in Cheng et al., "Crystal Growth of $KTiOPO_4$ isomorphs from tungstate and molybdate fluxes" J. of Crystal Growth 110, 697–703 (1991). An improved flux process for producing $KTiOPO_4$ and isomorphs using dopants selected from Ga, Al, and Si to lower the ionic conductivity of the resulting crystal is described in U.S. Pat. No. 5,084,206.

While reasonably large single crystals of $KTiOAsO_4$ can be grown by the known flux processes, the resulting crystals are known to generally contain fine microscopic domains of thin (roughly about 5 to 50 $\mu$m) layers of randomly oriented crystals running parallel to the natural faces (e.g., (011)) of $KTiOAsO_4$. This random multidomain structure renders the $KTiOAsO_4$ crystals useless for many electro-optic, piezoelectric and nonlinear optical applications. For example, Jani et al., Appl. Phys. Lett., 60 (19), 2327–2329 (1992) discloses that multidomain KTA crystals result in optical parametric oscillators with very low efficiency. G. M. Loiacono et al., Appl. Phys. Lett., 61(8), 895–897 (1992), indicates that the presence of domains in KTA causes a lack of second harmonic generation signal. There is thus a need for methods for conveniently providing potassium titanyl arsenate crystals which are useful for electro-optic, piezoelectric and nonlinear optical applications.

SUMMARY OF THE INVENTION

We have found that $CsTiOAsO_4$ and $RbTiOAsO_4$ are also subject to multidomain formation during conventional flux growth crystallization. This invention provides a composition consisting essentially of doped crystalline $MTiOAsO_4$ (where M is selected from the group consisting of K, Rb, Cs, and mixtures thereof) which contains at least about 10 ppm total of at least one dopant selected from the group consisting of Fe, Sc and In. This invention further provides a flux process for producing a doped crystal of $MTiOAsO_4$ which comprises the steps of (1) preparing a homogeneous melt containing the components for forming $MTiOAsO_4$ crystals and a flux comprising oxides of M and As and, optionally, one or more other flux modifiers (e.g., $WO_3$, $M_2SO_4$ and MF), (2) introducing a seed crystal of $MTiOAsO_4$ in the melt, (3) actuating the controlled crystallization on the seed crystal, and (4) continuing the crystallization until crystal formation is completed, and is characterized by: adding to said melt at least one dopant selected from the group consisting of Fe, Sc and In in an amount totalling at least about 0.01 percent by weight (based upon the total amount of $MTiOAsO_4$ formable from the components in the melt) effective to provide a doped single domain crystal of $MTiOAsO_4$ containing at least 10 ppm of said dopant. This invention further provides for a doped single domain crystal of $MTiOAsO_4$ containing at least about 10 ppm total of at least one dopant selected from the group consisting of Fe, Sc and In.

DETAILED DESCRIPTION OF THE INVENTION

Compositions are provided in accordance with this invention which consist essentially of doped crystalline $MTiOAsO_4$ which contains at least one dopant selected from the group consisting of iron, scandium and indium. Preferably, the doped crystalline $MTiOAsO_4$ is a single crystal (e.g., a single crystal of $KTiOAsO_4$, $RbTiOAsO_4$ or $CsTiOAsO_4$). The compositions are normally flux grown.

This invention provides doped crystalline $MTiOAsO_4$, preferably in the form of single crystals which have the orthorhombic structure of $KTiOPO_4$ with a $Pna2_1$ space group and are single domain.

In accordance with this invention, a small but effective amount of Fe, Sc and/or In dopant is incorporated within the crystalline structure. It is preferred that the Fe, Sc and/or In dopant be uniformly incorporated into the crystalline structure. The dopant is typically incorporated in an amount totaling at least about 10 ppm and is preferably at least about 100 ppm, and more preferably at least about 200. The upper limit can be as high as the maximum solubility of the Fe, Sc and/or In in crystalline $MTiOAsO_4$. Generally, the total amount of dopant is 15,000 ppm or less, and is typically 10,000 ppm or less. Preferably, for crystals with good optical homogeneity, the upper limit is about 5000 ppm. Single crystals of doped $MTiOAsO_4$ provided by this invention are considered superior for many applications to undoped $MTiOAsO_4$ crystals grown under the same conditions because the dopant effects a single domain structure in these crystals.

The process of this invention for producing a doped single crystal of $MTiOAsO_4$ can employ conventional flux process steps for producing a crystalline composition, including steps of preparing a homogeneous melt containing the components for forming $MTiOAsO_4$ crystals and a flux comprising oxides of M and As; introducing a seed crystal of $MTiOAsO_4$ in the melt; actuating the controlled crystallization on the seed crystal; and continuing the process until the crystal formation is completed.

The melt used in the process may also contain flux modifiers such as $WO_3$, $M_2SO_4$ and MF. Controlled crystallization on the seed crystal may be activated by a number of means, such as slow cooling or gradient transport. In the slow cooling method, a homogeneous melt capable of yielding $MTiOAsO_4$ is slowly cooled at a rate not greater than 10° C./hr (typically, 0.05° to 0.2° C./hr) in the presence of the seed. The melt is maintained at substantially isothermal conditions as the temperature is decreased continuously until the crystallization is completed. In the gradient transport process, an excess amount of crystalline $MTiOAsO_4$ nutrients is placed at the bottom of the melt, which is kept hotter than the upper part of the melt where the seed resides. In the presence of the temperature gradient, the flux dissolves the nutrients at the bottom and releases it on the surfaces of the seed leading to crystal growth. The use of multiple seeds and of forced convections are common in both of these methods. The components for forming $MTiOAsO_4$ crystals are well known in the art (see, for example, U.S. Pat. No. 4,231,838 which is hereby incorporated by reference); and include oxides of Ti, M and As, the precursors of the oxides of Ti, M and As, and materials composed of mixtures of the oxides and/or precursors of the oxides of Ti, M and As. The process of this invention, however, is characterized by adding Fe, Sc and/or In dopant to the melt in an amount effective to provide a doped single domain crystal of $MTiOAsO_4$ containing at least 10 ppm of said dopant. Generally, dopant is added in a total amount of at least about 0.01 percent by weight (calculated as the element and based on the total moles of $MTiOAsO_4$ formable from the components in the melt), and is preferably added in a total amount of at least about 0.02 percent by weight. Typically, the crystallization temperature is controlled to provide a doped single domain crystal of $MTiOAsO_4$ which typically contains from about 10 ppm to about 5000 ppm by weight of Fe, Sc and/or In. The upper limit of the Fe, Sc and/or In dopant in the flux is limited only by the melt temperature. Since the actual amount of Fe, Sc and/or In in the crystal is limited principly by the solubility of Fe, Sc and/or In in the $MTiOAsO_4$ crystal, there is generally no significant advantage in using excessive amounts of Fe, Sc and/or In in the melt. Accordingly, dopant is preferably added in an amount totalling about 2 percent by weight or less, more preferably about 1 percent by weight or less.

The crystallization temperature of the process of this invention (i.e., the temperature of the melt during growth of the doped crystal of $MTiOAsO_4$) typically is within the range of from about 650° C. to about 1100° C., preferably is within the range of from about 750° C. to about 950° C., and most preferably from about 800° C. to about 880° C.

The process of the invention can be practiced in any apparatus which calls for the maintenance of the suitable thermal conditions in the melt while suspending the seed crystal therein. For example, the apparatus described in the above-referenced article by Cheng et al., or in U.S. Pat. No. 4,761,202, which is hereby incorporated herein, may be used. It is preferred in the practice of this invention to provide for mixing of the melt during crystallization in order to provide uniform distribution of the dopant throughout the melt. A particularly suitable way to accomplish this is to rotate the crucible in which the melt is contained with the sense of rotation periodically reversed. It is also preferred that the seed crystal be rotated as well to prevent the build-up of dopants near the growing crystal surfaces. The seed crystal is typically rotated from 2 to 200 revolution per minutes (rpm) and preferably from 10 to 100 rpm, while the crucible is typically rotated from 5 to 60 rpm and preferably from 10 to 30 rpm. It is further recognized that the anisotropic incorporation of dopant by the crystals can lead to further non-uniformity in the property of these crystals. Single-sectored growth, facilitated by the use of a crystal plate as the seed crystal, is the most preferred way to eliminate this problem. Though not exclusive, {001}-, {011}-, {201}-, {110}- and {100}-sectored growth are effective.

Doped single domain crystals of $MTiOAsO_4$ are produced by this invention which contain at least about 10 ppm of at least one dopant selected from the group consisting of Fe, Sc and In. These include doped single domain crystals of $KTiOAsO_4$, $RbTiOAsO_4$, and $CsTiOAsO_4$. Preferably, the single crystals are at least $1 \times 1 \times 1$ $mm^3$. A doped $KTiOAsO_4$ crystal of this invention, like a useful undoped $KTiOAsO_4$ crystal, can contain various impurities as a result of impure starting materials, the fluxes used in the crystal preparation, etc., so long as these impurities are not present in an amount which substantially interferes with the single domain character of the crystal. $MTiOAsO_4$ single domain crystals are provided by this invention which have large and uniform piezoelectric and electro-optic responses, and give strong second harmonic generation intensities.

Practice of the invention is further illustrated by the following non-limiting examples.

EXAMPLES

The details of crystal growth experiments are given in Examples 1 through 7 below. The domain structure of these crystals was studied using several techniques: 1) piezoelectric mapping, 2) second harmonic generation and 3) electrostatic toning.

Piezoelectric Mapping $MTiOAsO_4$ possess large piezoelectric d coefficients. When a z-cut $MTiOAsO_4$ crystal is subjected to an external stress along the polar axis (i.e., z-direction), a voltage is established across the two opposing faces of the crystal. The magnitude and the polarity of this signal depends on the domain structure of the crystal and the magnitude of the applied stress such that a maximum signal (e.g., about 75 $\mu V$ for $KTiOAsO_4$) corresponds to a single domain crystal response while a multidomain crystal gives a substantially lower signal (e.g., typically from 0 to 30 $\mu$V for KTiOAsO$_4$). Thus by measuring the piezoelectric voltage generated by a point stress (in this case, a Channel Products d$_{33}$ meter with a point contact; modulation frequency about 100 Hz) across the z-cut surface, one can study the domain structure of the crystal. A uniform piezoelectric map (both in magnitude and in sign) means that the crystal is single domain, while a multidomain crystal gives a piezoelectric map with much weaker response and frequent sign changes.

Second Harmonic Generation

Microscopic domains can significantly decrease the second harmonic generation (SHG) efficiency. This phenomena is well documented. See e.g., J. D. Bierlein et al., Appl. Phys. Lett. 51, 1322 (1987); and P. F. Bordui et al., J. of Crystal Growth, 113, 61 (1991). For the purpose of this invention, we measured the angular dependence and the intensity of the SHG output. Rectangular xyz blocks of MTiOAsO$_4$ were cut from the as-grown crystals and their x and y surfaces were polished with standard polishing techniques. A Ti-sapphire laser operating near 1 $\mu$m was used as the first harmonic input propagating along the x or y direction. The frequency doubled output was projected onto a screen to reveal the angular dependence and its intensity. A single domain KTiOPO$_4$ crystal was used as a Control. A broad angular dependence and a weak (typically 3–100 times less) SHG signal are characteristics of a multidomain crystal. For KTiOAsO$_4$ crystals with a single domain structure, the SHG signal is generally about twice that of the control KTiOPO$_4$ crystal, and has a sharp angular dependence.

Electrostatic Toning

The opposite polarity at the z-surface of a multidomain crystal can be studied by an electrostatic decoration technique. In this technique, a MTiOAsO$_4$ crystal is cooled to about $-77°$ C. using a dry ice and acetone mixture. This cooling creates an electric field pattern, via the pyroelectric effect, that mimics the underlying domain structure of the MTiOAsO$_4$ crystal. A drop of black liquid electrostatic toner in a hydrocarbon solvent is applied to the crystal and allowed to equilibrate. The toner particles align themselves in accordance with the electric field pattern, thus revealing the domain structure of the crystal. A single domain crystal generally gives uniform, weak toning or no toning at all. Thus a well formed toning pattern is taken to be indicative of the presence of a multidomain structure.

EXAMPLE 1

A mixture of 208.7 g of WO$_3$, 207.3 g K$_2$CO$_3$, 137.9 g As$_2$O$_5$, 24 g of TiO$_2$, and 1.0 g of Fe$_2$O$_3$ (i.e., 0.6 weight percent doping of the melt) was melted in a 250 ml platinum crucible and soaked at 1050° C. in a muffle furnace. The crucible was then placed into a substantially isothermal, top-loading furnace and brought to about 880° C. A commercial seed rotation and pulling assembly was used to submerge two off-centered KTiOAsO$_4$ seed-crystals about 20 mm below the melt surface. The seed crystals were spun at 5 to 30 rpm with the direction of rotation reversed regularly. The furnace was continuously cooled at about 0.05° to 0.1° C./hr for a period of 16 days. This procedure yielded two 20×15×25 mm$^3$ inclusion-free crystals, which were pulled out of the melt and annealed to room temperature at a 15° C./hr cooling rate. A 3×4×5 mm$^3$ xyz block cut from one of these crystals gave efficient second harmonic generation confirming that the crystals were single-domain. The Fe-content in these crystals was about 0.3 weight percent as measured by Inductively Coupled Plasma Emission Spectroscopy. The results are summarized in Table I.

EXAMPLE 2

A mixture of 208.7 g of WO$_3$, 207.3 g K$_2$CO$_3$, 137.9 g As$_2$O$_5$, 24 g of TiO$_2$, and 0.1 g of Fe$_2$O$_3$ (i.e., 0.1 weight percent doping of the melt) was melted in a 250 ml platinum crucible and soaked at 1050° C. in a muffle furnace. The crucible was then placed into a substantially isothermal, top-loading furnace and brought to about 880° C. A commercial seed rotation and pulling assembly was used to submerge one on-centered (201) KTiOAsO$_4$ seed-crystal about 20 mm below the melt surface. The seed crystals were spun at about 5 to 40 rpm with the direction of rotation reversed regularly. The furnace was continuously cooled at about 0.05° to 0.1° C./hr for a period of 20 days. This procedure yielded one 15×16×28 mm$^3$ inclusion-free crystal, which was pulled out of the melt and annealed to room temperature at a 15° C./hr cooling rate. A 15×5×4 mm$^3$ xyz block cut from this crystal gave efficient second harmonic generation confirming that the as grown crystal was single-domain. The Fe-content in the crystal was about 0.04 weight percent as measured by Inductively Coupled Plasma Emission Spectroscopy. The results are summarized in Table I.

EXAMPLE 3

A mixture of 162 g KH$_2$AsO$_4$, 147 g of K$_2$WO$_4$, 39 g of Li$_2$WO$_4$, 36 g of TiO$_2$, 9 g of K$_2$SO$_4$ and 0.5 g of Sc$_2$O$_3$ (i.e., 0.44 weight percent doping of the melt) was melted in a 250 ml platinum crucible, covered with a platinum lid and heated to about 1050° C. in a muffle furnace. After soaking at 1050° C. for 24 hours, the temperature was cooled at about 5° C./hr to 1010° C. and then at about 0.4° C./hr to induce crystal growth. The cooling continued until the temperature reached 685° C. The resulting crystals were separated from the molten tungstate flux by quickly removing the crucible from the furnace and pouring off the molten flux onto a cold 0.5" thick aluminum plate. To prevent thermally-induced cracking of the crystals, the crucible containing the crystals was immediately placed back into the muffle furnace and slowly annealed to room temperature at about 30° C./hr. Hot diluted hydrochloric acid was used to etch off any residual flux attached to the crystals. Many large 10×10×15 mm$^3$ crystals are recovered and fabricated into (001) plates and xyz blocks for the testing described above. The as-grown KTiOAsO$_4$ crystals obtained by this procedure contained about 0.14 weight percent Sc as measured by Inductively Coupled Plasma Emission Spectroscopy, and were single-domain. The results are summarized in Table I.

EXAMPLE 4

A mixture of 162 g KH$_2$AsO$_4$, 147 g of K$_2$WO$_4$, 39 g of Li$_2$WO$_4$, 36 g of TiO$_2$, 9 g of K$_2$SO$_4$ and 0.5 g of In$_2$O$_3$ (i.e., 0.38 weight percent doping of the melt) were melted in a 250 ml platinum crucible, covered with a platinum lid and heated to about 1050° C. in a muffle furnace. After soaking at 1050° C. for 24 hours, the temperature was cooled at about 5° C./hr to 1010° C. and then at about 0.4° C./hr to induce crystal growth. The cooling continued until the temperature reached 685° C. The resulting crystals were separated from the molten tungstate flux by quickly removing the crucible from the furnace and pouring off the molten flux onto a cold 0.5" thick aluminum plate. To prevent thermally-induced cracking of the crystals, the crucible containing the crystals was immediately placed back into the muffle furnace and slowly annealed to room temperature at about 30° C./hr. Hot diluted hydrochloric acid was used to etch off any residual flux attached to the crystals. Many large $10 \times 10 \times 15$ mm$^3$ crystals were recovered and fabricated into (001) plates and xyz blocks for the testing described above. The as-grown KTiOAsO$_4$ crystals obtained by this procedure contained about 0.3 weight percent In as measured by Inductively Coupled Plasma Emission Spectroscopy, and were single-domain. The results are summarized in Table I.

EXAMPLE 5

A mixture of 266.6 g of WO$_3$, 223.1 g K$_2$CO$_3$, 172.7 g As$_2$O$_5$, 49.2 g of TiO$_2$, 38.3 g of K$_2$WO$_4$ and 10.2 g of Li$_2$WO$_4$ were melted in a 250 ml platinum crucible and soaked at 1050° C. in a muffle furnace. The crucible was then placed into a substantially isothermal, top-loading furnace and brought to about 930° C. A commercial seed rotation and pulling assembly was used to submerge one on-centered {201}-oriented KTiOAsO$_4$ seed-crystal about 25 mm below the melt surface. The seed crystal was spun at 5 to 45 rpm with the direction of rotation reversed regularly. The furnace was continuously cooled at about 0.1° C./hr for a period of 30 days. This yields one $25 \times 27 \times 53$ mm$^3$ inclusion-free crystal, which was pulled out of the melt and annealed to room temperature at a 15° C./hr cooling rate. Numerous xyz blocks cut from this crystal gave weak and broad second harmonic generation signals which are characteristics of highly multi-domain crystals. Electrostatic toning independently confirmed the multi-domain structure of this crystal. The results are summarized in Table I.

TABLE I

| Ex. No. | Dopants | Dopant Content (wt %) | SHG signal[1] | Piezoelectric signal |
|---|---|---|---|---|
| 1 | Fe | 0.31% | strong | 65–75 $\mu$V |
| 2 | Fe | 0.04% | strong | 40–60 $\mu$V |
| 3 | Sc | 0.14% | strong | 60–70 $\mu$V |
| 4 | In | 0.30% | strong | 55–65 $\mu$V |
| 5 (Control) | none | none | weak | 0–30 $\mu$V |

[1]SHG means second harmonic generation

The results summarized in Table I demonstrate that the addition of an effective amount of Fe, Sc and/or In into the flux melt facilitates the formation of single domain structure in the as-grown MTiOAsO$_4$ crystals, while the undoped melt crystals are highly multidomain (see Example 5).

EXAMPLE 6

A mixture of 421.1 g of Cs$_2$CO$_3$, 206.6 g As$_2$O$_5$, 49.2 g of TiO$_2$, and 1.0 g of In$_2$O$_3$ (i.e., 0.16 weight percent doping in the melt) were melted in a 250 ml platinum crucible and soaked at 1050° C. in a muffle furnace. The crucible was then placed into a substantially isothermal, top-loading furnace and brought to about 810° C. A commercial seed rotation and pulling assembly was used to submerge one CsTiOAsO$_4$ seed crystal about 20 mm below the melt surface. The seed crystal was spun at 5 to 30 rpm with the direction of rotation reversed regularly. The furnace was continuously cooled at about 0.05° to 0.1° C./hr. for a period of 16 days. This procedure yielded a $12 \times 24 \times 39$ mm$^3$ inclusion-free crystal, which when pulled out of the melt and annealed to room temperature at a 10° C./hr. cooling rate. One (011) plate (about $10 \times 20 \times 1$ mm$^3$) and one (001) slab (about $10 \times 6 \times 3$ mm$^3$) were cut from this crystal and tested for single domainness. Both samples gave large piezoelectric signals (about 120 microvolts for the (001) slab) which were generally uniform across the entire area of the plate. These results further demonstrate that doping in accordance with this invention facilitates single domain formation in the crystal growth of the titanyl arsenates.

EXAMPLE 7

A mixture of 357.1 g of Rb$_2$CO$_3$, 251.2 g As$_2$O$_5$, 29.8 g of TiO$_2$, and 1.0 g of Sc$_2$O$_3$ (i.e., 0.18 weight percent doping in the melt) were melted in a 250 ml platinum crucible and soaked at 1050° C. in a muffle furnace. The crucible was then placed into a substantially isothermal, top-loading furnace and brought to about 881° C. A commercial seed rotation and pulling assembly was used to submerge one RbTiOAsO$_4$ seed crystal about 20 mm below the melt surface. The seed crystal was spun at 5 to 30 rpm with the direction of rotation reversed regularly. The furnace was continuously cooled at about 0.05°–0.1° C./hr. for a period of 16 days. This procedure yielded a $9 \times 21 \times 24$ mm$^3$ inclusion-free crystal, which was pulled out of the melt and annealed to room temperature at a 15° C./hr. cooling rate. One (001) plate (about $8 \times 15 \times 1$ mm$^3$) was cut from this crystal and tested for single domainness. The plate gave large piezoelectric signals (about 72 micro-volts) which were uniform across the entire area of the plate. These results further demonstrate that doping in accordance with this invention facilitates single domain formation in the crystal growth of the titanyl arsenates.

The Examples include particular embodiments of the invention. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the following claims.

What is claimed is:

1. A process for producing a single crystal of MTiOAsO$_4$ wherein M is selected from the group consisting of K, Rb, Cs and mixtures thereof, comprising the steps of preparing a homogeneous melt containing the components for forming MTiOAsO$_4$ and a flux comprising oxides of M and As; introducing a seed crystal of MTiOAsO$_4$ in the melt; actuating the controlled crystallization on the seed crystal; and continuing the crystallization until formation of the crystal is completed, characterized by: producing a single domaon crystal by adding to said melt at least one dopant selected from the group consisting of Fe, Sc, In in an amount totalling at least about 0.01 percent by weight, based upon the total amount of MTiOAsO$_4$ formable from the components in the melt, effective to provide a doped single domain crystal of MTiOAsO$_4$ containing at least 10 ppm of said dopant.

2. The process of claim 1 wherein M is K.

3. The process of claim 1 wherein M is Rb.

4. The process of claim 1 wherein M is Cs.

5. The process of claim 1 wherein the flux further comprises a flux modifier.

6. The process of claim 1 wherein the crystallization temperature is within the range of from about 650° C. to about 1100° C.

7. The process of claim 1 wherein the crystallization temperature is within the range of from about 750° C. to about 950° C.

8. The process of claim 1 wherein the crystallization temperature is within the range of from about 800° C. to 880° C.

9. The process of claim 1 wherein a crystal plate is used as the seed crystal to achieve single-sectored crystal growth.

10. A single domain crystal of $MTiOAsO_4$ wherein M is selected from the group consisting of K, Rb, Cs and mixtures thereof, produced by the process of claim 1.

* * * * *